United States Patent
Ebenhart et al.

(10) Patent No.: US 12,283,805 B2
(45) Date of Patent: Apr. 22, 2025

(54) BUS BAR ASSEMBLY

(71) Applicant: BorgWarner US Technologies LLC, Wilmington, DE (US)

(72) Inventors: Mark Alan Ebenhart, Kokomo, IN (US); Kirk E. McClure, Kokomo, IN (US)

(73) Assignee: BorgWarner US Technologies LLC, Auburn Hills, MI (US)

( * ) Notice: Subject to any disclaimer, the term of this patent is extended or adjusted under 35 U.S.C. 154(b) by 244 days.

(21) Appl. No.: 18/193,238

(22) Filed: Mar. 30, 2023

(65) Prior Publication Data
US 2024/0332936 A1  Oct. 3, 2024

(51) Int. Cl.
| | |
|---|---|
| *H02G 5/04* | (2006.01) |
| *B60R 16/02* | (2006.01) |
| *G01R 15/18* | (2006.01) |
| *G01R 31/18* | (2006.01) |

(52) U.S. Cl.
CPC .............. *H02G 5/04* (2013.01); *B60R 16/02* (2013.01); *G01R 15/181* (2013.01)

(58) Field of Classification Search
CPC ........ G01R 15/00; G01R 15/14; G01R 15/18; G01R 15/181; G01R 15/20; G01R 15/202; G01R 15/207; G01R 31/00; G01R 31/36; G01R 31/364; H02G 5/00; H02G 5/04; B60R 16/00; B60R 16/02
USPC ...................................... 324/76.11, 126, 127
See application file for complete search history.

(56) References Cited

U.S. PATENT DOCUMENTS

| | | | | |
|---|---|---|---|---|
| 6,149,106 A | * | 11/2000 | McQuistian | B61L 5/107 246/220 |
| 8,427,133 B2 | * | 4/2013 | Ito | G01R 15/207 324/117 R |
| 11,287,451 B2 | | 3/2022 | Tamura et al. | |
| 11,340,268 B2 | * | 5/2022 | Wriessnegger | G01R 15/207 |
| 11,874,303 B2 | * | 1/2024 | Reiter | G01R 15/207 |
| 12,025,640 B2 | * | 7/2024 | Ichijyo | H02P 5/74 |
| 12,112,865 B2 | * | 10/2024 | Messier | G01R 15/207 |
| 12,166,429 B2 | * | 12/2024 | Yamahira | H02P 5/74 |
| 2022/0214382 A1 | | 7/2022 | Wolf et al. | |
| 2023/0273244 A1 | * | 8/2023 | Spitzer | G01R 15/207 324/117 H |
| 2023/0298779 A1 | * | 9/2023 | Messier | H01B 5/02 324/114 |

(Continued)

FOREIGN PATENT DOCUMENTS

| | | | |
|---|---|---|---|
| JP | 2015089168 A | 5/2015 | |
| JP | 5731363 B2 | 6/2015 | |

(Continued)

*Primary Examiner* — Hoai-An D. Nguyen
(74) *Attorney, Agent, or Firm* — Joshua M. Haines; Bookoff McAndrews, PLLC (57) ABSTRACT

A bus bar assembly includes a first housing; a first bus bar extending through the first housing; a second bus bar extending through the first housing, the second bus bar including a second housing that defines at least one first receiver configured to engage a fastener; and a sensor assembly mounted to the receiver, the sensor assembly including a current sensor positioned between the first bus bar and the second bus bar. The sensor assembly may not include a magnetic core, and the current sensor may be a coreless sensor configured to detect a current through the bus bar assembly.

20 Claims, 7 Drawing Sheets

(56) References Cited

U.S. PATENT DOCUMENTS

2024/0297414 A1* 9/2024 Nam .................. H01M 10/482
2024/0332936 A1* 10/2024 Ebenhart .................. H02G 5/04

FOREIGN PATENT DOCUMENTS

| JP | 2015145838 A | 8/2015 |
| WO | 2019117171 A1 | 6/2019 |
| WO | 2020170683 A1 | 8/2020 |

* cited by examiner

BUS BAR ASSEMBLY

TECHNICAL FIELD

Various embodiments of the present disclosure relate generally to bus bar assemblies, and more specifically, to bus bar assemblies that may be incorporated in electric vehicles and include sensors configured to measure parameters related to operations of the bus bar assemblies.

INTRODUCTION

Power electronics in vehicles may incorporate high voltage batteries and other power electronic devices (e.g., high-power inverters) to manage energy output and, in the case of electric vehicles, energy regeneration. Sensors are one of several types of components that may be incorporated, particularly within electric vehicles, to ensure safe operations of such power electronics.

In some implementations, sensors, such as current sensors, may assist an electronic control unit (ECU) or electronic control module (ECM) with redundancy of power calculations, diagnostics, and the like. For example, current sensors, such as high voltage (HV) direct current (DC) current sensors, may be included with power electronics to measure current through bus bars configured to carry power from a battery to other components in a vehicle. However, current sensors of a type used for this purpose typically have substantial volume, are difficult to package or install in vehicles due to space constraints, and present thermal issues that must be mitigated often times with additional components and/or structural modifications.

SUMMARY OF THE DISCLOSURE

In some aspects, the techniques described herein relate to a bus bar assembly including a first housing; a first bus bar extending through the first housing; a second bus bar extending through the first housing, the second bus bar including a second housing that defines at least one first receiver configured to engage a fastener; a sensor assembly mounted to the receiver, the sensor assembly including a current sensor positioned between the first bus bar and the second bus bar; wherein the sensor assembly does not include a magnetic core; and wherein the current sensor is a coreless sensor configured to detect a current through the bus bar assembly.

In some aspects, the techniques described herein relate to a bus bar assembly wherein the sensor assembly includes a substrate mounted on the at least one first receiver, and wherein the substrate is positioned between the second bus bar and a raised section of the first bus bar.

In some aspects, the techniques described herein relate to a bus bar assembly wherein the at least one first receiver includes two first receivers, each of the first receivers extends from a side of the second housing that extends parallel to a longitudinal axis of a body of the second bus bar.

In some aspects, the techniques described herein relate to a bus bar assembly wherein a first body of the first bus bar includes: a first bend extending from the raised section of the first body at a first angle; a first leg extending from the first bend; a second bend extending from the first leg at a second angle; and a first extension extending from the second bend.

In some aspects, the techniques described herein relate to a bus bar assembly wherein a second body of the second bus bar includes: a third bend extending from the second body at a third angle; a second leg extending from the third bend; a fourth bend extending from the second leg at a fourth angle; and a second extension extending from the fourth bend.

In some aspects, the techniques described herein relate to a bus bar assembly wherein the first leg extends along a direction substantially parallel to the second leg.

In some aspects, the techniques described herein relate to a bus bar assembly wherein the first extension extends in a first direction and the second extension extends in a second direction opposite to the first direction.

In some aspects, the techniques described herein relate to a bus bar assembly wherein the first bus bar includes a first body that extends through the first housing and defines a base, a step, and a raised section, the second bus bar includes a second body that extends through the first housing and engages the second housing, a first area of the first bus bar corresponds with the raised section of the first body, a first cross-section of the first bus bar in the first area being continuous in at least two planes; and a second area of the second bus bar corresponds with the first area and a portion of the second housing including the at least one receiver, a second cross-section of the second bus bar in the second area being continuous in the at least two planes.

In some aspects, the techniques described herein relate to a bus bar assembly wherein the raised section of the first bus bar defines a first bus facing surface, wherein a surface of the second bus bar corresponding to the second area defines a second bus facing surface, and wherein a distance between the first bus facing surface and the second bus facing surface is less than 4 millimeters (mm).

In some aspects, the techniques described herein relate to a bus bar assembly wherein the distance is in a range of approximately 2 mm to approximately 4 mm.

In some aspects, the techniques described herein relate to a bus bar assembly wherein the first bus bar is a positive bus bar and the second bus bar is a negative bus bar.

In some aspects, the techniques described herein relate to a bus bar assembly wherein the at least one first receiver includes a casting in contact with a second body of the second bus bar, wherein the casting is configured to provide a ground for the second bus bar.

In some aspects, the techniques described herein relate to a bus bar assembly wherein a power signal is applied to the bus bar assembly and a magnetic flux generated by the first bus bar is added to a magnetic flux generated by the second bus bar at least in a space coinciding with the sensor assembly.

In some aspects, the techniques described herein relate to a bus bar assembly including a body; a housing surrounding the body; at least one first receiver extends from a first side of the housing; a sensor assembly mounted on housing; and a fastener engaged to the sensor assembly and the at least one first receiver, wherein a first portion of the body corresponds to a second portion of the housing including the at least one first receiver, and wherein a cross-section of the first portion of the body is continuous in at least two planes.

In some aspects, the techniques described herein relate to a bus bar assembly wherein the housing includes an end face, and wherein a second receiver extends from the end face.

In some aspects, the techniques described herein relate to a bus bar assembly wherein the body includes: a first bend extending at a first angle relative to plane corresponding to the first portion of the body; a leg extending from the first bend; a second bend extending from the first leg at a second angle; and an extension extending from the second bend, wherein the leg is disposed between the first portion of the body and the end face of the housing.

In some aspects, the techniques described herein relate to a bus bar assembly wherein the sensor assembly includes: a substrate; a connector mounted on the substrate; and a current sensor mounted on the substrate, wherein the substrate defines an aperture, and wherein the fastener engages the aperture.

In some aspects, the techniques described herein relate to a bus bar assembly wherein the current sensor is positioned on the substrate between the first side of the housing and a side of the housing opposite the first side.

In some aspects, the techniques described herein relate to a bus bar assembly including a first housing; a first bus bar including a first body extending through the first housing, the first body defining a base, a step, and a raised section; a second bus bar including a second body extending through the first housing and a second housing engaged to the second body, the second housing defining a receiver configured to engage a fastener, wherein a first area of the first bus bar corresponds with the raised section of the first body, a first cross-section of a first portion of the first bus bar corresponding to a location of the sensor assembly is continuous in at least two planes; and wherein a second area of the second bus bar corresponds with the first area and a portion of the housing including the receiver, a second cross-section of a second portion of the second bus bar corresponding to the location of the sensor assembly is continuous in the at least two planes.

In some aspects, the techniques described herein relate to a bus bar assembly wherein further including a current sensor mounted to the receiver, wherein a power signal is applied to the bus bar assembly and a magnetic flux generated by the first bus bar is added to a magnetic flux generated by the second bus bar at least in a space that coincides with a location of the current sensor.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of +10% in the stated value. In this disclosure, unless stated otherwise, any numeric value may include a possible variation of +10% in the stated value.

As used herein, "above," "below," "to the right side of," "to the left side of," etc., may be relative terms that might, or might not, correspond to actual spatial orientations of the components when implemented in an electric vehicle. As used herein, "substantially perpendicular" may refer to a first surface being provided at an angle of 90° to a second surface, or within a threshold angle to the second surface (e.g., 85°, 95°, etc.). As used herein, "substantially planar" may refer to a first surface being provided at an angle of 0° to a second surface, or within a threshold angle of the second surface (e.g., 5°, −5°, etc.).

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Sensors commonly used to measure current through bus bars incorporated in, for example, electric vehicles, are typically stand-alone cored sensors that have substantial volume and are difficult to package or install in vehicles due to space constraints. As a result of the size and mounting requirements characteristic of these types of cored-configurations, bus bars may have to be separated from close proximity, which is not consistent with best practices in the relevant art. Furthermore, in an assembly including bus bars and a cored sensor, the bus bars may have pem nuts and screws that may have to be added to the bus bars to secure the current sensor to the assembly. During operation, the bolted interface may be a source of heat that must be mitigated.

Various embodiments of the present disclosure relate generally to systems, devices, and methods for providing bus bar assemblies that include bus bars configured to accommodate sensor assemblies for measuring one or more operating parameters of the bus bar assemblies. In particular, various embodiments of the present disclosure relate to bus bar assemblies including exemplary bus bar and sensor assembly arrangements that allow for the utilization of sensor assemblies including coreless sensors for measuring current through bus bars.

Figure 1A:
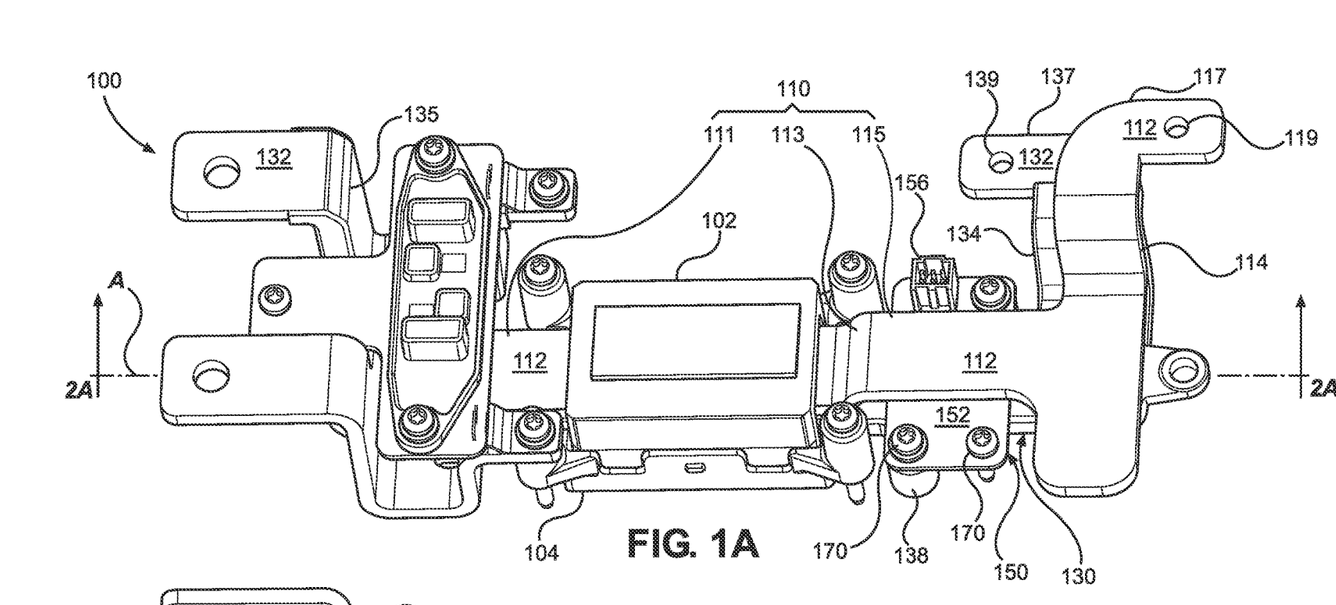
FIG. 1A depicts an overhead isometric view of an exemplary bus bar assembly, according to one or more embodiments.
Figure 1B:
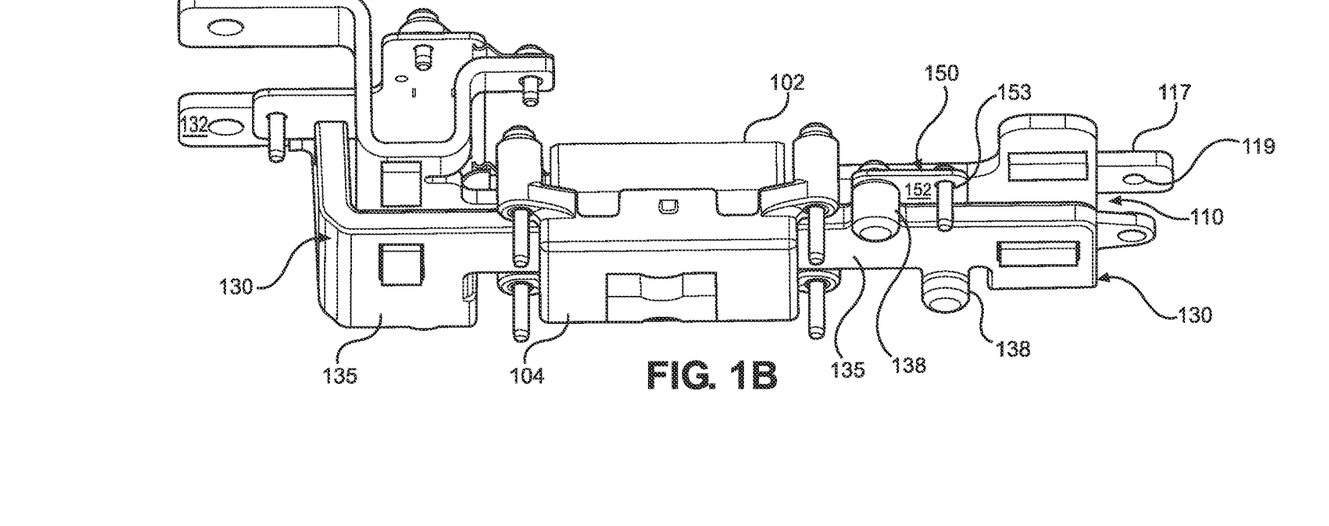
FIG. 1B depicts a bottom isometric view of the exemplary bus bar assembly of FIG. 1A.

FIGS. 1A and 1B depict overhead and bottom isometric views of a bus bar assembly 100, according to one or more embodiments. As shown, the bus bar assembly 100 includes a first bus bar 110 disposed on a second bus bar 130. In one embodiment, the first and second bus bars 110, 130 may function as positive and negative bus bars, respectively. In other embodiments, the first and second bus bars 110, 130 may function as negative and positive bus bars, respectively.

In some embodiments, a bus bar may be, for example, a rigid conductor formed of a material having high conductivity so as to conduct a high current. In some non-limiting examples, the bus bars may be formed from copper or copper alloy, and be configured to conduct a current of varying magnitudes. In some examples the current through the bus bars may be less than, substantially equal too, or more than 900 amperes (A). In other examples, the current through the bus bars may be less than, substantially equal too, or more than 1200 A. A bus bar may be used to construct an electrical circuit configured to carry high current. The bus bar may be coated with a conductive material, such as Nickel (Ni), Tin (Sn), Zinc (Zn), Ni-Palladium (Pd), Silver (Ag), Gold (Au), Aluminum (Al), Copper (Cu), or the like, in order to provide corrosion resistance for the bus bar.

The first and second bus bars 110, 130 may extend through a first housing 102 positioned on and/or in a support 104. In one example, the first housing 102 may provide or serve as a choke configured to limit peak value of line (supply) current that is output through the bus bar assembly 100. In addition, as a choke, the first housing 102 may mitigate harmonics transmitted from the first and second bus bars 110, 130. In still other examples, the first housing 102, functioning as a choke, may add impedance to reduce harmonics without causing a noticeable drop in voltage.

Figure 1C:
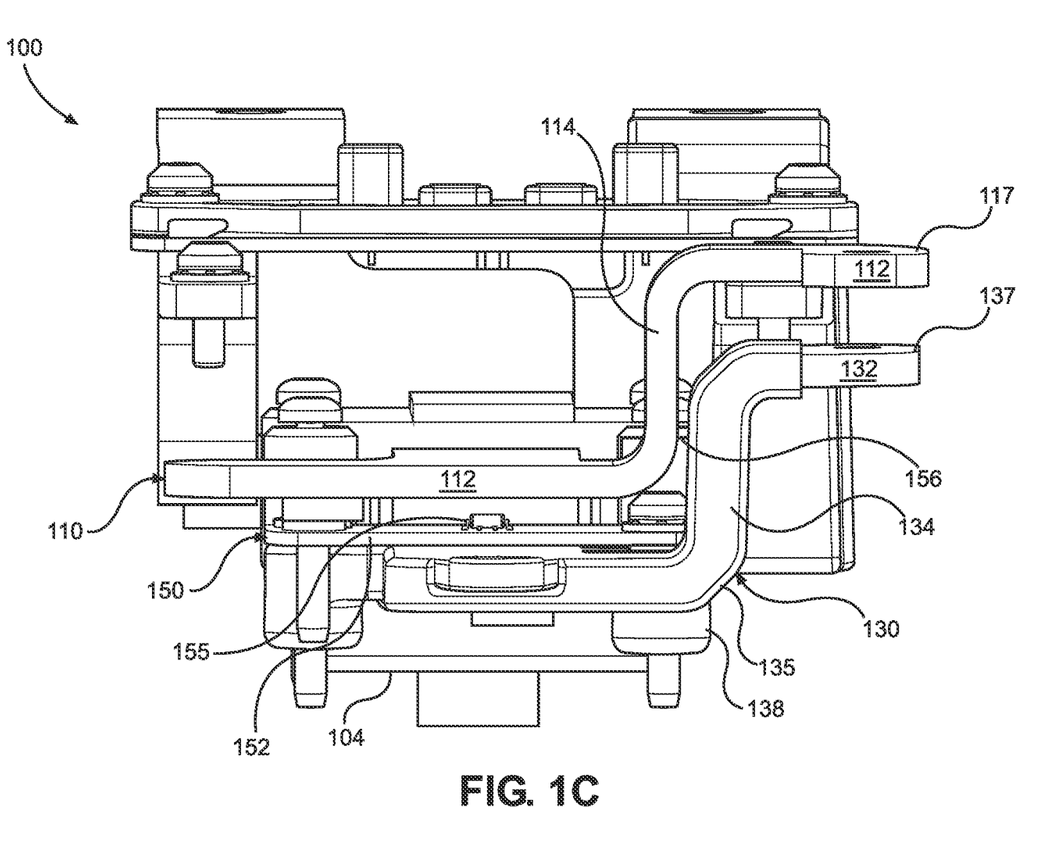
FIG. 1C depicts an elevation view of an end of the exemplary bus bar assembly of FIG. 1A.
Figure 2A:
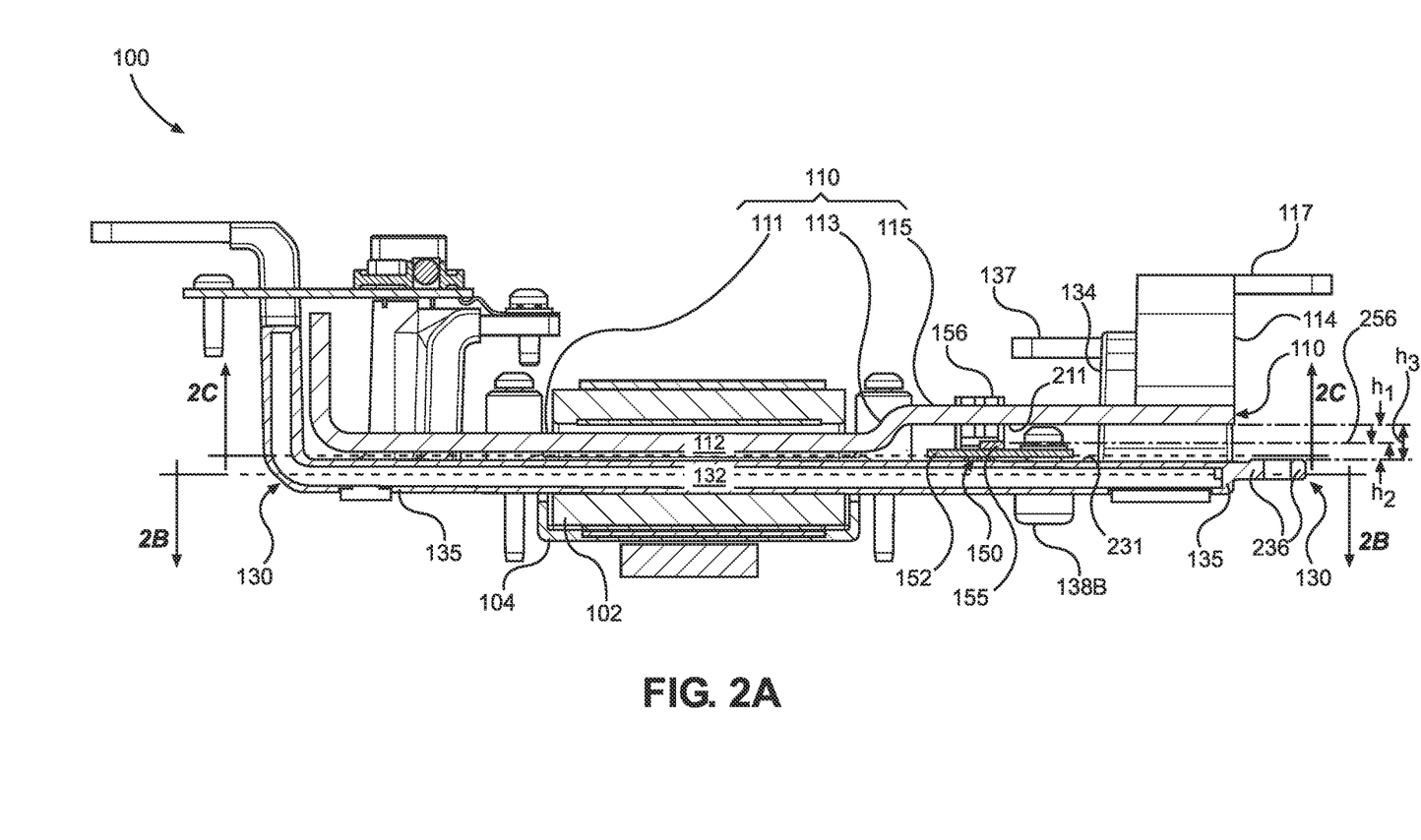
FIG. 2A depicts a cross-sectional view of the exemplary bus bar assembly of FIGS. 1A-1C, from a plane corresponding to axis A illustrated in FIG. 1A.
Figure 2B:
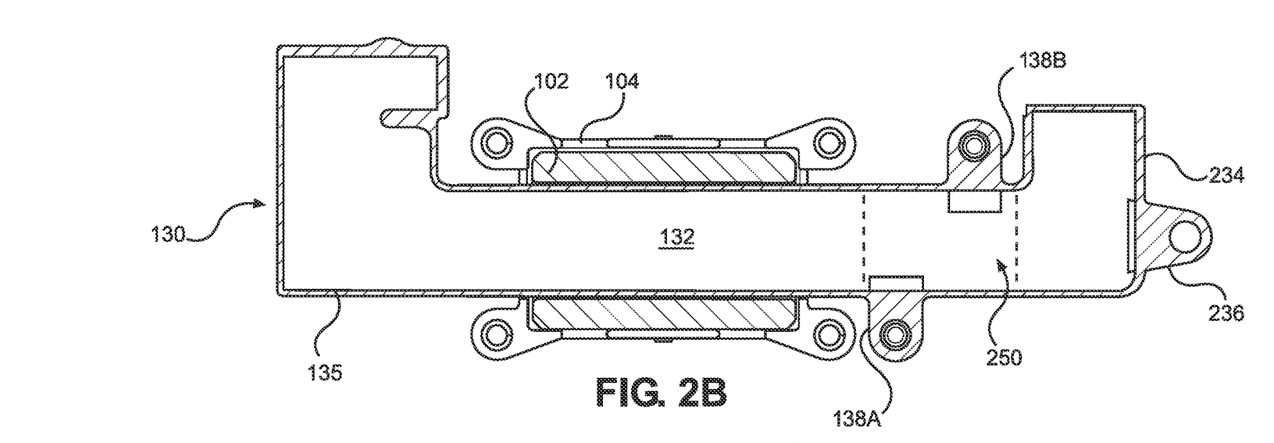
FIG. 2B depicts a cross-sectional view of the exemplary bus bar assembly of FIGS. 1A-1C, from a plane corresponding to line 2B-2B of FIG. 2A.

The first bus bar 110 includes a first body 112 that extends through the first housing 102, and a first leg 114 that extends from the first body 112 at an angle. The first leg 114 may include a first extension 117 and a first aperture 119 defined in a body of the first extension 117. The second bus bar 130 includes a second body 132 disposed in a second housing 135. Those portions of the second body 132 extending outside of the second housing 135 are illustrated in FIGS. 1A-1C, whereas cross-sections of the second body 132 are depicted in FIGS. 2A and 2B. Similar to the first bus bar 110, the second bus bar 130 includes the second body 132 that extends through the first housing 102, and a second leg 134 that extends from the second body 132 at an angle. The second leg 134 may include a second extension 137 and a second aperture 139 defined in a body of the second extension 137.

Each of the first and second apertures 119, 139 may be configured to receive a fastener, such as a bolt. More specifically, the first and second apertures 119, 139 may be utilized to connect the first and second bus bars 110, 130 to a power electronics device such that the bus bar assembly 100 transfers electrical power to other components through the power electronics devices. In one embodiment, the first and second extensions 117, 137 may be connected to a power electronics device, such as an inverter, and configured to conduct a current that may be less than, substantially equal too, or more than 900 A and transfer a high voltage (HV) direct current (DC) signal from an HV battery to the inverter. In another embodiment, the first and second extensions 117, 137 may be configured to conduct a current that may be less than, substantially equal too, or more than 1200 A. In some examples, the first and second extensions 117, 137 may be connected to a capacitor for the inverter.

In one embodiment, the first and second bus bars 110, 130 may be connected to a power source such as an HV battery, and transfer electrical power from the HV battery to other components incorporated in, for example, an electric vehicle. In some embodiments, electrical power transferred through the first and second bus bars 110, 130 may be a primary power supply for substantially all driving operations of an electrical vehicle. In still other embodiments, electrical power transferred through the first and second bus bars 110, 130 may be sufficient or provide a main power supply used to power substantially all components and operations of an electric vehicle.

A sensor assembly 150 is positioned between the first and second bus bars 110, 130, and is configured to detect a current in the first and second bars 110, 130. The sensor assembly 150 may be mounted to a second housing 135. The second housing 135 may be formed from a non-electrically conductive material (e.g., plastic) and be engaged to the second bus bar 130. In some embodiments, the second housing 135 may be formed around or otherwise surround portions of the second bus bar 130. Additionally, as shown in FIGS. 1A and 1B, the second housing 135 may include first receivers 138 configured to receive fasteners 170 that may secure the sensor assembly 150 to the bus bar assembly 100.

FIG. 1C depicts an elevation view of an end of the exemplary bus bar assembly 100 of FIG. 1A. As shown in FIG. 1C, the sensor assembly 150 is positioned between the first and second bus bars 110, 130. In one embodiment, the sensor assembly 150 may include a substrate 152 (e.g., a printed circuit board (PCB)), as well as a connector 156 and a sensor 155 mounted on the substrate 152.

According to some aspects of the present disclosure, the sensor 155 may be a current sensor configured to detect magnetic fields. In some embodiments, the sensor 155 may be a transducer or magnetic based magnetic field sensor. The sensor 155 may include a point field detector. In other embodiments, the sensor 155 may be a current sensor configured for DC and alternating current (AC) measurements. According to an aspect of the present disclosure, the sensor 155 may be configured to implement galvanic isolated current sensing. In addition, in some embodiments, the sensor 155 may include a Hall-effect sensor, such as an open-loop Hall-effect sensor, a Complementary Metal-Oxide-Semiconductor (CMOS) Hall-effect sensor, or the like. In some embodiments, the sensor 155 may be programmable, and/or configured to provide a thermometer output, and/or provide a programmable switch function. In still other embodiments, the sensor 155 may not be programmable. According to some aspects of the present disclosure, the sensor 155 may be comprised of a monolithic sensor integrated circuit. According to other aspects of the present disclosure, the sensor 155 may be comprised of a small outline integrated circuit (SOIC) and/or provided with a single die.

FIG. 2A depicts a cross-sectional view of the exemplary bus bar assembly 100 of FIGS. 1A-1C, from a plane corresponding to axis A, also designated as line 2A-2A, illustrated in FIG. 1A. The axis A extends through overlapping portions of the first body 112 of the first bus bar 110, the second body 132 of the second bus bar 130, and the sensor 155 mounted on the substrate 152. In one example, the plane may extend through substantially central portions (relative to respective widths) of these components.

The sensor 155 of the sensor assembly 150 may be disposed between the substrate 152 and the raised section 115 of the first body 112 of the first bus bar 110. As a result of this configuration, exemplary sensor assemblies according the present disclosure, such as the sensor assembly 150 of FIG. 2A, do not include magnetic cores.

A sensor assembly including a sensor with a magnetic core may cost substantially more than exemplary sensor assemblies according to the present disclosure, such as sensor assembly 150. With respect to current sensors, a magnetic core may be the most expensive component of a sensor assembly including such a current sensor. In addition, in some applications, because of heat that may be generated by the magnetic core, such sensor assemblies may require additional components (e.g., thermal pads) to mitigate this operational characteristic of a cored sensor incorporated therein. On the other hand, sensor assemblies that may be incorporated in the bus bar assemblies according to the present disclosure do not require, and thus do not include, magnetic cores and may cost less than sensor assemblies including cored sensors.

As shown in FIG. 2A, the first body 112 of the first bus bar 110 includes a base 111 and a raised section 115 extending from opposite sides of a step 113 formed in the first bus bar 110. The raised section 115 may extend from a side of the step 113 in a direction away from the first housing 102 as shown. On the other hand, the second body 132 of the second bus bar 130 defines a substantially straight or planar run from the second leg 134, through the first housing 102, and to a side of the first housing 102 opposite a side of the first housing 102 that faces the sensor assembly 150. As shown, the second body 132 may be surrounded by a second housing 135. In one example, the second housing 135 may be formed from a non-conductive material to prevent a voltage for the first and second bus bars 110, 130 from being grounded through any unintended path. In one example, the housing 135 may be formed from an overmold plastic material. In other examples, the housing 135 may be formed from a semi-crystalline thermoplastic material having a composition that is 30% glass. As described in more detail with reference to FIG. 2B, the second housing 135 may include first receivers 138 configured to receive fasteners 170 for securing the sensor assembly 150 to the second bus bar 130.

The substrate 152 may be electrically isolated from both of first and second bus bars 110, 130, and a position of the substrate 152 between the first and second bus bars 110, 130 may be tolerant to variation. This is true despite the fact that sensors lacking a magnetic core, as is the case with sensor 155, are typically very sensitive to bus bar positions and variations. However, a magnetic field generated by the first and second bus bars is substantially homogeneous, such that a position of the substrate 152 and the sensor 155 can vary.

More specifically, during operation of the bus bar assembly 100, a strong and stable magnetic field may be generated between the first and second bus bars 110, 130, particularly in an area where the sensor 155 may be positioned. As a result of the strength and homogeneity of magnetic field generated between the first and second bus bars 110, 130, a position of the sensor 155 relative to the first and second bus bars 110, 130 may not provide a design constraint that must be accommodated for in some embodiments. Accordingly, a position of the sensor assembly 150, and in particular the sensor 155, relative to the first and second bus bars 110, 130, may vary.

To illustrate the above mentioned feature, FIG. 2A depicts a first distance $h_1$ between a reference point 256 on the sensor 155 and a first bus facing surface 211 (i.e., a surface of the first bus bar 110 facing the second bus bar 130). In one example, the reference point 256 may correspond approximately with a center of the sensor 155 in a vertical direction of FIG. 2A. A second distance $h_2$ is identified in FIG. 2A between the reference point 256 and a second bus facing surface 231 (i.e., a surface of the second bus bar 130 facing the first bus bar 110). A third distance $h_3$ is identified in FIG. 2A between the first bus facing surface 211 and the second bus facing surface 231.

One or more embodiments according to the present disclosure may include arrangements in which the third distance $h_3$ between the first and second bus facing surfaces 211, 231 is such that a position of the sensor 155 relative to the first and second bus bars 110, 130 may not be a limiting factor for a design, placement, or configuration for other components. In other examples, the third distance $h_3$ between the first and bus bars 110, 130 for some exemplary arrangements for the bus bar assembly 100 may be of a value that renders a position of the sensor 155 relative to either of first or second bus bars 110, 130 to have substantially no effect on performance generally, nor a current magnitude detection accuracy, specifically.

According to other aspects of the present disclosure, the third distance $h_3$ between the first and second bus facing surfaces 211, 231 may vary. In some examples the third distance $h_3$ may be less than or substantially equal to 4 millimeters (mm). In other examples, the third distance $h_3$ may be equal to or greater than 2 mm. At least where the third distance $h_3$ is between 4 mm and 2 mm, a position of the sensor 155 relative to the first and second bus bars 110, 130 may not be a limiting factor for a design, placement, or configuration for other components. More specifically, within this range a variation with respect to mechanical tolerance may be +/−0.3. Thus, at least within the above range, a position of the sensor 155 relative to either of first or second bus bars 110, 130 may have substantially no effect on performance generally, nor a current magnitude detection accuracy, specifically. In addition, for configurations in which the third distance $h_3$ is within the ranges described above, the first distance $h_1$ may be greater than, equal to, or less than the second distance $h_2$.

The above mentioned range for the third distance $h_3$ is exemplary and is not included herein to establish that a particular level of performance of the bus bar assembly 100 may only be accomplished where the third distance $h_3$ is within that range. Certain levels of performance with respect to current magnitude detection accuracy, mechanical tolerance (including the variation mentioned above), and positional flexibility of the substrate 152 and sensor 155 relative to the first and second bus bars 110, 130 may be achieved for arrangements in which the third distance $h_3$ may be less than 2 mm or greater than 4 mm. The above range for the third distance $h_3$ is merely provided as an example for which certain levels of performance for accuracy, tolerance, and positional flexibility have already been obtained. In some examples, the third distance $h_3$ between the first and second bus bars 110, 130 may be determined based on requirements such as voltage, creepage, clearance, and/or pollution degree.

The first receivers 138 and fasteners 170 of the bus bar assembly 100 may allow for assembling the bus bar assembly 100 or installing the bus bar assembly 100 in another component (e.g., power electronic devices), to take advantage of the positional flexibility of the sensor assembly 150. More specifically, in some embodiments, the first receivers 138 and the fasteners 170 may be threaded. In other embodiments the apertures 153 defined in the substrate 152 may also be threaded. In still other embodiments, the fasteners 170 may be secured to the first receivers 138 with washers or spacers (not shown).

In still other examples, that substrate 152 may be provided with one or more male-type (e.g., prongs, clips) or female-type (e.g., recesses, slots, etc.) fastening structures and the first receivers 138 may be provided with corresponding female-type or male-type fastening structures. Furthermore the substrate 152 may be able to pop or snap in and be sufficiently secured to the first receivers 138 using these fastening structures without fasteners such as the fasteners 170. One of ordinary skill in the art will recognize that this type of arrangement may allow for removal of the substrate 152 from the bus bar assembly 100, for the purposes of diagnostic review, repair, and/or replacement, using a pry tool, for example. Accordingly, in some embodiments, fastening mechanisms other than the fasteners 170 illustrated in FIGS. 1A-2C, may be used and include components formed as part of the substrate 152 of the second housing 135.

To adjust or set a position of the substrate 152, the fasteners 170 may be screwed through the apertures 153 and/or into the first receivers 138 to a particular extent. Furthermore, the washer or spacers may be incorporated between the substrate 152 and the first receivers 138 to adjust distances between the substrate 152 and the first and second substrate facing surfaces 211, 231. Either of these methods of position adjustment may be accomplished without affecting an operational integrity of the sensor 155. As a result, during an installation of the bus bar assembly 100 in another device or apparatus a position of the sensor assembly 150 may be adjusted to accommodate other components of the device or apparatus located near an install site for the bus bar assembly 100.

With the sensor 155 being able to perform its intended function from multiple positions relative to the first and second bus bars 110, 130, the bus bar assembly 100 may accommodate various types of space constraints presented by different applications. Furthermore, as compared to a sensor that includes, for example, a magnetic core that requires bus bars to be substantially spaced apart and not arranged in close proximity to each other, the first and second bus bars 110, 130 may be in close proximity have a reduced footprint relative to sensors with magnetic cores. This also allows an assembly that directionally follows electromagnetic compatibility (EMC) and ground loop best practices, in contrast to solutions that may include, for example, sensors (e.g., current sensors) including magnetic cores.

A review of FIG. 2A, particularly in the area including the sensor assembly 150, reveals that each of the first and second bus bars 110, 130 respectively has substantially uniform thickness. As will be explained more with respect to FIG. 3, relative to an ability of the sensor 155 to accurately detect a magnitude of current flowing through the bus bar assembly 100, a configuration of the first and second bus bars 110, 130 obviates a need for a magnetic field concentrator. As a result, profiles of the first and second bus bars 110, 130 along planes represented in FIGS. 2A-2C may be substantially uniform, that is, have substantially fewer transitions (e.g., surface area reductions), or turns, or other discontinuities (e.g., apertures, protrusions, recesses, etc.).

Figure 2C:
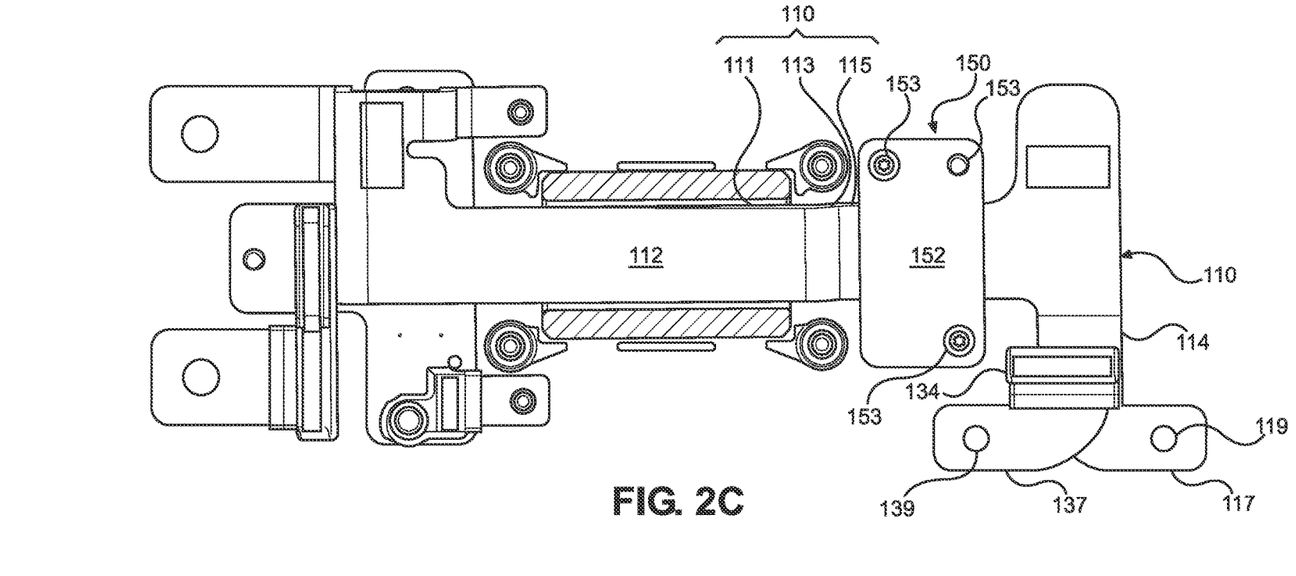
FIG. 2C depicts a cross-sectional view of the exemplary bus bar assembly of FIGS. 1A-1C, from a plane corresponding to line 2C-2C of FIG. 2A.

FIGS. 2B and 2C depict cross-sectional and partial cross-sectional views of the bus bar assembly 100, from planes corresponding to lines 2B-2B and 20-2C in FIG. 2A. One of ordinary skill in the art will appreciate that FIGS. 2B and 2C do not reflect the sectioning depicted in FIG. 2A. Rather FIGS. 2B and 2C represent views of the bus bar assembly 100 from planes corresponding to the lines illustrated in FIG. 2A, as those planes may be applied to the bus bar assembly 100 as presented in FIGS. 1A-1C.

From FIG. 2B, the extent to which the second housing 135 surrounds the second bus bar 130 can be appreciated. In FIG. 2B, the first receivers 138 are designated with numerals 138A and 138B and may be referred to here after respectively as proximal first receiver 138A and distal first receiver 138B, or first receivers 138. As shown, the second housing 135 may include the first receivers 138, monolithically formed with side walls of the second housing 135. As shown, the first receivers 138 may include bores configured to receive the fasteners 170.

The second housing 135 may also define a second receiver 236 extending from an end face 234 of the second bus bar 130. In one or more embodiments, the second receiver 236 may be engaged by fasteners configured to engage with an interface, such a threaded bore, provided in another piece of equipment or a device. According to one embodiment, a fastener 170 may engage the second receiver 236 and a threaded bore of a casing for an exemplary power electronics device. As a result of this arrangement, a portion of the second bus bar 130 including the second leg 134 may be secured to the casing in such a way that mitigates transmission of vibrations between the bus bar assembly 100 and power device incorporated in the exemplary power electronics device. This may in turn, reduce opportunities for the second bus bar 130, as well as the bus bar assembly 100, to vibrate during operations of the bus bar assembly 100 and/or the power electronics device, which may otherwise occur absent the engagement facilitated by the second receiver 236.

Continuing with FIG. 2B, a sensor area 250 located in a section of the second bus bar 130 between the first receivers 138 is identified for reference purposes. The sensor area 250 is intended to approximate a location where the sensor assembly 150 is disposed above the second bus bar 130. As shown, a cross-section of the second bus bar 130 is substantially uniform in the sensor area 250. More specifically, the second bus bar 130 is not configured to include a surface area reduction typical of a coreless sensor implementations in, near, or around the sensor area 250. Such surface area reductions may resemble a two bottlenecks extending from respective "neck" areas in opposite directions from a central point. One of ordinary skill in the art may recognize "neck-down" as a term of art for such surface area reductions. Regardless of name, a surface area reduction, serving as a magnetic field concentrator, is advantageously not required for exemplary bus bar assemblies according to the present disclosure, for the reasons discussed below with reference to FIG. 3.

In one or more embodiments, the first receivers 138 include a proximal receiver 138A and a distal receiver 138B relative to the first housing 102. In some embodiments, one or both of the proximal and distal receivers 138A, 138B may include a casted portion extending from, or otherwise in conductive communication with, the second body 132 of the second bus bar 130. Furthermore, the proximal receiver 138A may accommodate (be configured to engage) a fastener 170 of a first size (e.g., length, thread diameter), and the distal receiver 138B may accommodate a fastener 170 of a second size different than the first size.

In some examples, the first and second sizes of the fasteners 170 may be such that one of the fasteners 170 contacts only a housing portion of a respective receiver. On the other hand, the other of the two fasteners 170 may be sized such that it contacts a casting portion of its respective receiver and thereby pickups up a ground signal from the second bus bar 130. Alternatively, the proximal receiver 138A may be configured differently from the distal receiver 138B such that fasteners of the same size are used but only one picks up a ground signal because a configuration of the receiver it is engaged with. In other examples, a ground signal may instead, or additionally, be routed through the connector 156 on the substrate 152.

Turning to FIG. 2C, a cross-sectional view of the first housing 102 and bottom views of the first bus bar 110 and the sensor assembly 150 are depicted. As is apparent from a review of FIG. 1A and FIG. 2C, similar to the second bus bar 130, the first bus bar 110 is not configured to include a surface area reduction in, near, or around the sensor assembly 150. One of ordinary skill in the art will recognize a neck down as significant narrowing or reduction in a width of a bus bar. As with the second bus bar 130, such a surface area reduction is not required.

In practice, exemplary bus bar assemblies according to one or more embodiments, may be constructed in phases, and various tests may be performed on the assembly and/or sub-assemblies thereof in different phases of the construction. Thus, some sub-assemblies of the bus bar assembly 100 may be tested separately from the bus bar assembly 100 itself. In one embodiment, the sensor assembly 150 and the second bus bar 130 could be assembled and tested before incorporation in the bus bar assembly 100. In another embodiment, the bus bar assembly 100 may be substantially assembled with all but the sensor assembly 150. In some examples, the sensor 155 may be assembled with the sensor assembly 150 and pre-calibrated before an end of line test. In still another embodiment, the bus bar assembly 100, including the sensor assembly 150, may be substantially assembled but for the sensor 155 being integrated into the sensor assembly 150. In the exemplary assembly processes described above, calibration of the sensor 155 may be completed off-sequence instead of at a final testing phase. Thus, a final testing phase may only include an end for line test of a fully assembled bus bar assembly 100, instead of a calibration of the sensor 155 and then an end of line test for the bus bar assembly 100.

Bus bars provided in specific shapes, particularly shapes including drastically necked-down portions, whether it be because of space constraints or for magnetic field concentration, may exhibit substantial concentrations of heat as current flows through in these portions. That is, a significant reduction in the cross-sectional area of a bus bar may give rise an overheating condition during bus operation that may contribute to a device failure. One result of the relative positioning of the sensor 155 and the first and second bus bars 110, 130 in close proximity to one another is that complex shaping (e.g., multiple turns over relatively small sections) or modifications (e.g., drilling apertures, extreme necking down, etc.) of bus bars are not required. Such shaping or modifications are not required to ensure reliable sensed parameter readings are obtained from the sensor 155. In turn, disadvantages related to heat concentrating in locations corresponding where various modifications or shapes are implemented, may be avoided.

As described above, exemplary configurations for bus bar assemblies according to the present disclosure, such as the exemplary bus bar assembly of FIGS. 1A-2C, provide bus bars, such as the first and second bus bars 110, 130, that are coupled together in close proximity to one another and a sensor assembly, such as the sensor assembly 150. Close arrangements of bus bars as provided by the exemplary bus bar assemblies described herein provide several advantages including but not limited to: a reduced inductance loop; simple construction; resilience to disruptions in magnetic fields owing to the placement of items and/or system components near the bus bars; reduction of stray magnetic fields; and a lack of sensitivity to mechanical tolerances, particularly with respects to a location of a sensor relative to bus bars.

Figure 3:
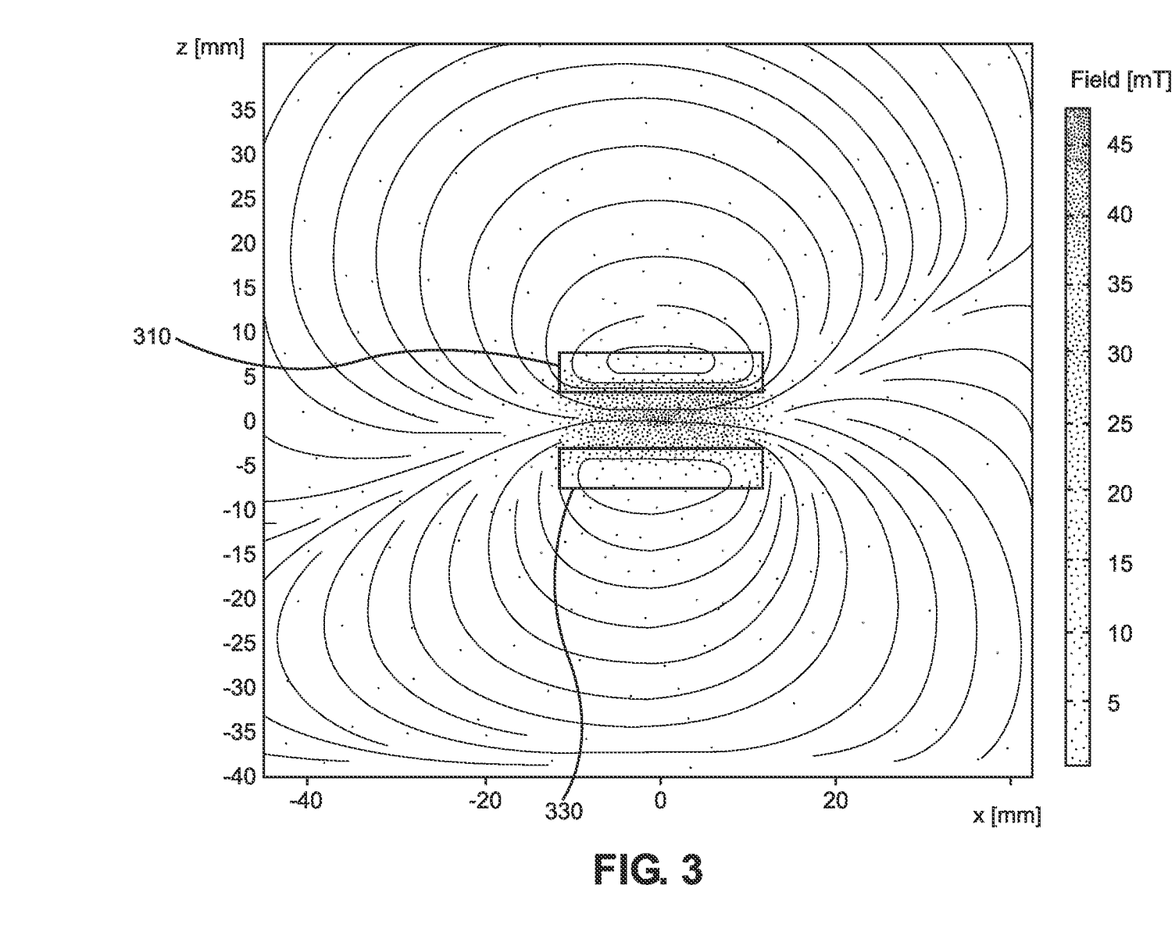
FIG. 3 depicts an exemplary simulation of magnetic fields that may be generated by bus bars of a bus bar assembly, according to one or more embodiments.

FIG. 3 depicts an exemplary simulation of magnetic fields that may be generated by bus bars of an exemplary bus bar assembly, according to one or more embodiments. More specifically, FIG. 3 provides a contour plot that represents: (A) sizes of first and second conductors 310, 330 with the X and Z-axes; (B) relative positions of the first and second conductors 310, 330 with the Z-axis; and (C) an interaction of magnetic fields generated by first and second conductor 310, 330 carrying a current with a Y-axis—"Field [mT]."

According to some aspects of the present disclosure, specifications (e.g., $h_1$, $h_2$, $h_3$) for the first and second conductors 310, 330 may correspond to values of design parameters for exemplary versions of first and second bus bars for an exemplary bus bar assembly according to the present disclosure. For the contour plot of FIG. 3, the first and second conductors 310, 330 may represent a model of first and second bus bars that are: (1) incorporated in an exemplary bus bar assembly according to the present disclosure; and (2) configured as a positive bus bar wrapped on top of a negative bus bar. In addition, the contour plot of FIG. 3 may provide a visual representation of an interaction of magnetic fields between the first and second conductors 310, 330, carrying a current of 900 A, for example.

In some examples, for a bus bar assembly according to the present disclosure with bus bars separated by a third distance $h_3$ of approximately 4 mm and conducting a current of 900 A, a field strength produced may be approximately 32.4 millitesla (mT). In other examples, where the current is 1200 A, a field strength produced by the bus bars in this arrangement may be approximately 43.2 mT. A field factor, which is a measure of signal to noise ratio (SNR), for this arrangement may be approximately 36 microtesla/amphere ($\mu$T/A). In other examples, for a bus bar assembly according to the present disclosure with bus bars separated by a third distance $h_3$ of approximately 2 mm, a field factor for this arrangement may be approximately 39 $\mu$T/A.

As shown in FIG. 3, a strong stable field is generated between the first and second conductors 310, 330. More specifically, a review of the Y-axis field-strength scale and an area between the first and second conductors 310, 330 reveals a substantially homogeneous magnetic field of a strength on the high end of the field-strength scale. This may be due, at least in part, to the fact that magnetic fluxes of the first and second conductors 310, 330 are in the same direction and therefore substantially doubled. Because the fluxes are doubled, a high signal to noise ratio exists between the first and second conductors 310, 330 as evidenced by the visual representation of magnetic field interaction provided by FIG. 3. Also with respect to the magnetic fluxes, the first and second conductors 310, 330 directionally follow EMC best practices such that a high level of EMC is exhibited there between.

As a simulation for an exemplary configuration of bus bars according to the present disclosure, such as the first and second bus bars 110, 130, the contour plot of FIG. 3 represents a utilization of additive magnetic flux that may yield consistent and accurate sensor operations by a current sensor, for example. More specifically, the strength and homogeneity of the magnetic field between the first and second conductors 310, 330 identifies an area in which a sensor, such as the sensor 155, may be located without precision and still be able register accurate parameter (e.g., current) readings. As indicated with the first and second conductors 310, 330, magnetic flux between bus bars, such as the first and second bus bars 110, 130, may be doubled and a resultant magnetic field may be substantially homogeneous and strong over a substantial entirety of a space that is: (A) between the first and second bus facing surfaces 211, 231; and (B) spatially bounded by at least overlapping segments of the widths and lengths of the first and second bus bars 110, 130. As a result, the sensor 155 may operate effectively and accurately, at least with respect to detecting current, if positioned substantially anywhere within the space as defined above.

Thus, exemplary bus bar configurations described herein obviate a need to identify an exact location and precisely position a sensor in such an exact location in order for the sensor to deliver accurate readings of a sensed parameter. In addition, alignment of a substrate, such as the substrate 152 of the bus bar assembly 100, in as many as three dimensions, may also require only approximation due to the strength and homogeneity of the magnetic field strength. In addition to placement of a sensor and sensor related components being made easier, the strength and homogeneity of a magnetic field between bus bars also obviates the need for extensive design and engineering related to individual bus bar configuration. More specifically, bus bars, such as the first and second bus bars 110, 130, do not require surface area reduction sections, punch holes, or other similar structural features to ensure a field strength around a sensor is sufficiently strong and stable for the sensor to effectively operate.

Figure 4:
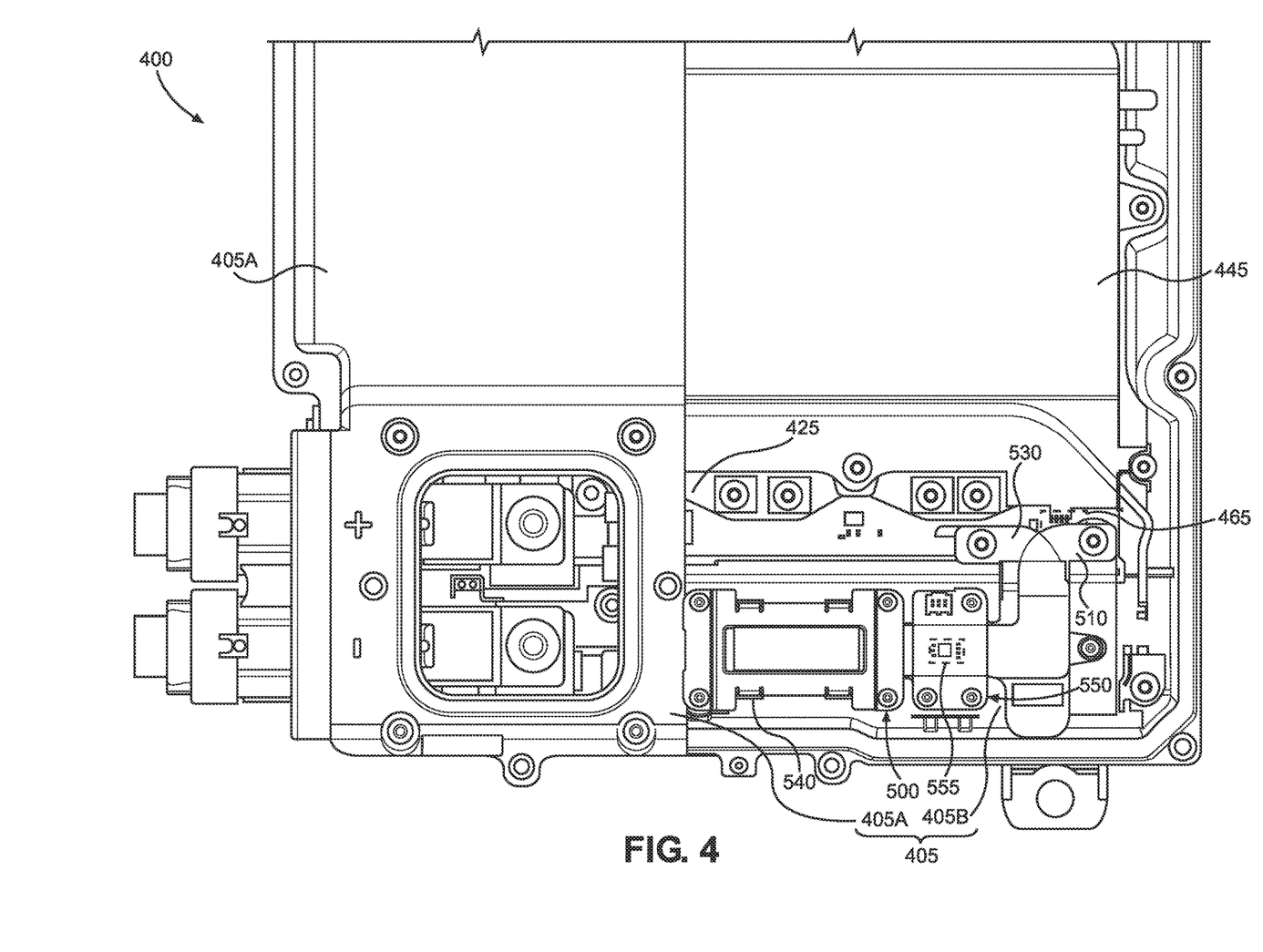
FIG. 4 depicts an overhead partial view of a power electronics device including an exemplary bus bar assembly that incorporates an exemplary sensor assembly, according to one or more embodiments.
Figure 5:
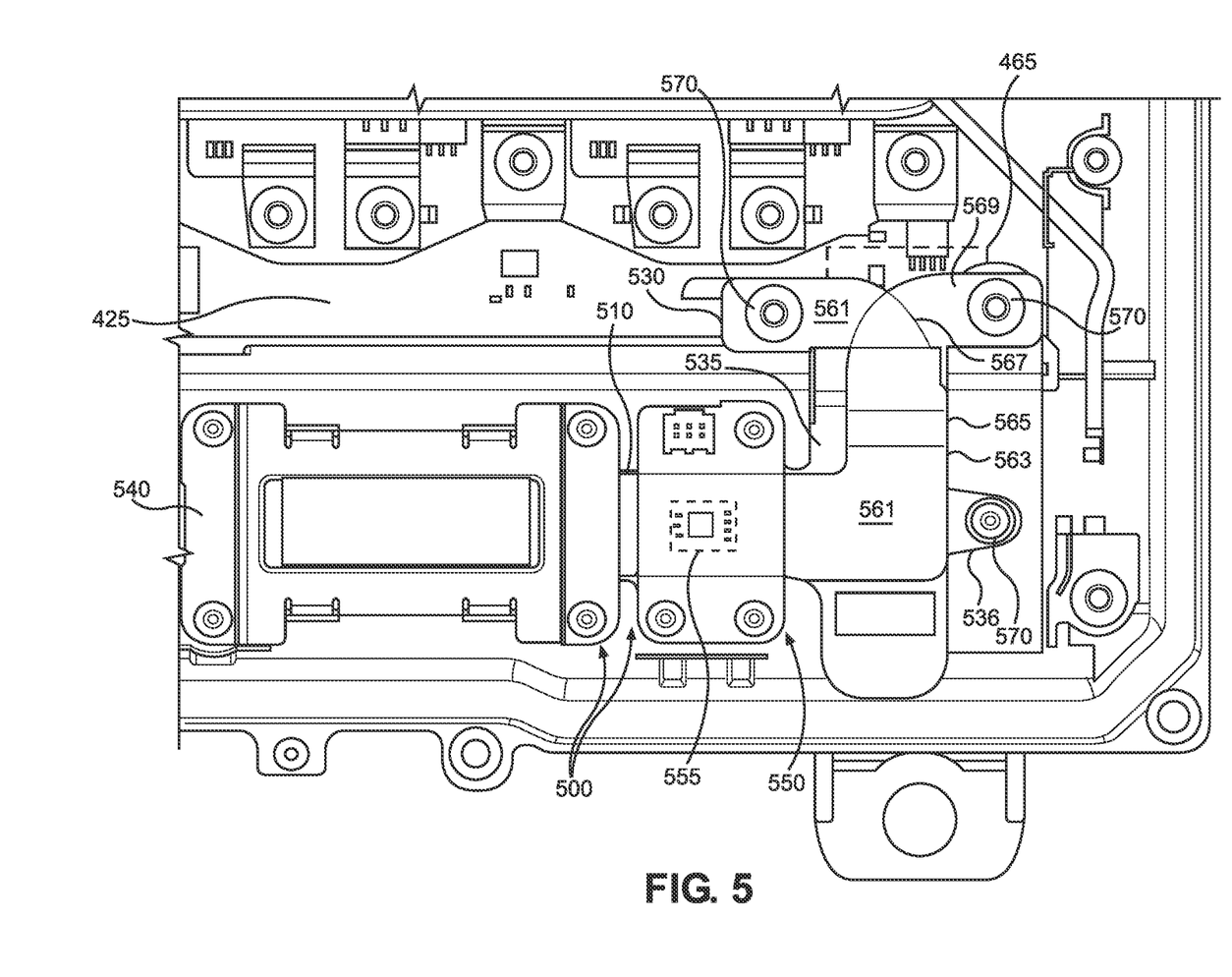
FIG. 5 depicts an enlarged view of a portion of FIG. 4 that includes the bus bar assembly of FIG. 4.

FIG. 4 depicts an overhead partial view of a power electronics device 400 including an exemplary bus bar assembly 500 that incorporates an exemplary sensor assembly 550, according to one or more embodiments. In one or more embodiments, the power electronics device 400 may provide an inverter 425 and be incorporated in an electric vehicle (not shown). More specifically, the power electronics device 400 may provide a traction inverter configured to be connected to a battery (e.g., an electric battery) and an electric motor, and propel, or otherwise cause movement of the electric vehicle. In one or more embodiments, the power electronics device 400 that may include, inter alia, a casing 405 including first and second casings 405A, 405B, an inverter 425 and a cap 445 disposed between the first and second casings 405A, 405B, and an exemplary bus bar assembly 500 according to one or more embodiments of the present disclosure. In FIGS. 4 and 5, a portion of the first casing 405A is cut out in order to show the bus bar assembly 500.

In one or more embodiments, all current generated to propel an electric vehicle including the exemplary power electronics device 400, may be transferred through first and second bus bars 510, 530 of the bus bar assembly 500. On a side of a housing 540 housing 540 opposite a connection with the inverter 425, the first and second bus bars 510, 530 may be connected through a high voltage DC connection to a battery pack. In one example, the housing may provide or otherwise serve as a choke. From the housing 540, the first and second bus bars 510, 530 may be connected, and transfer power to, a capacitor 465 and power devices (not shown) of the inverter 425 disposed under the cap 445. In one or more embodiments, the power devices may be configured to convert the DC power signal transferred through the bus bar assembly 500 into an alternating current (AC) power signal that be transferred to and power a three phase AC motor in the electric vehicle.

FIG. 5 depicts an enlarged view of a portion of FIG. 4 including the bus bar assembly 500. Advantages of the exemplary bus bar assembly 500 include a simplified design that, as shown, generally does not require complex mechanical joints, screws, pem nuts, added bends, or the like, and specifically does not require these features with respect to a sensor assembly 550. Rather, first and second bus bars 510, 530 may be routed through the housing 540, and over and under, respectively, a sensor assembly 550/sensor 555. In addition, the first and second bus bars 510, 540 may be turned up with a first bend 563 for a leg 565 from a respective body 561 and turned to one side or the other with a second bend 567 for a respective extension 569. Each extension 569 may be secured to the inverter 425 with a single fastener 570. At least one of the extensions 569 connected to the inverter 425 proximate to a capacitor 465. In addition, the bus bar assembly 500 may be secured to the second casing 405B of the power electronics device 400 by another fastener 570 engaged with a receiver 538 extending from a housing 535 of the second bus bar 530.

Operation of several components within the casing 405, including the bus bar assembly 500, may be accompanied by a respective generation of heat. One of ordinary skill in the art will recognize that a level of heat within the casing 405 may be affected by how tightly the components within the casing 405 are packed. Thus, providing a bus bar assembly with a smaller footprint, without more, may reduce the chances of adverse heat conditions arising. Both (1) the physical arrangement of the sensor assembly 550 and the first and second bus bars 510, 530, and (2) a configuration of the first and second bus bars 510, 530, contribute to several heat related advantages provided by the exemplary bus bar assembly 500 in the context of the power electronics device application illustrated with FIGS. 4 and 5.

First, similar to other exemplary bus bar assemblies of the present disclosure, a sensor 555 of the sensor assembly 500, the first bus bar 510, and the second bus bar 530 are arranged in relative close proximity. The sensor assembly 550, due to this arrangement, does not include a magnetic core. As compared to a bus bar solution including a cored sensor, the mere absence of a space consuming magnetic core of the cored sensor lends to a more compact footprint within the power electronics device 400 for the bus bar assembly 500 within the casing 405. Furthermore, as the first and second bus bars 510, 530 do not have be spaced apart to accommodate the sensor, EMC issues attendant to such spaced apart configurations are not present.

Second, a size of the housing 540 of the bus bar assembly 500 may be reduced relative to a choke for a bus bar solution including a cored sensor. The size of the housing 540 may be dictated by a degree of EMC mitigation required for reliable bus bar and sensor operation. Unlike bus bar solutions including cored sensors, operation of the sensor 555 and first and second bus bars 510, 530 directionally follow EMC and ground loop best practices. This comes as a result of the sensor 555 being positioned between the first and second bus bars 510, 530. In addition, the first and second bus bars 510, 530 having consistent cross-sectional areas also favorably contributes to EMC. Accordingly, bus bar assemblies according to the present disclosure, such as the bus bar assembly 500, require chokes of smaller sizes than bus bar solutions including cored sensors.

Vibrations, which may occur with cored sensor solutions, may also present thermal issues. As the bus bar assembly 500 does not include a cored sensor, the simple (threaded) engagement between the fastener 570, receiver 538, and the second casing 405B may secure the second bus bar 530 to the casing 405 in a manner that mitigates generation and propagation of vibrations. Accordingly, as installed in the power electronics device 400, the bus bar assembly 500 does not require complex structural arrangements designed to limit vibrations. It follows that thermal issues stemming from vibrations causing or resulting, for example, from failures of components of these complex structures, are also absent.

In addition, despite the proximity to the capacitor 465, connection between the first and second bus bars 510, 530 and the inverter 425 in this area is simple and does not include, nor need to rely on complex structures or multiple connections that may fail. Furthermore, the connection is not subject to vibratory motion of a magnetic core of a current sensor positioned near the connection, as is the case for many bus bar solutions including cored sensors. Rather, vibrations by at least the second bus bar 530 are mitigated by the coupling provided by the fastener 570, receiver 538, and a connection point (not shown) provided by the second casing 405B.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A bus bar assembly comprising:
a first housing;
a first bus bar extending through the first housing;
a second bus bar extending through the first housing, the second bus bar including a second housing that defines at least one first receiver configured to engage a fastener; and
a sensor assembly mounted to the receiver, the sensor assembly including a current sensor positioned between the first bus bar and the second bus bar,
wherein the sensor assembly does not include a magnetic core, and
wherein the current sensor is a coreless sensor configured to detect a current through the bus bar assembly.

2. The bus bar assembly of claim 1, wherein the sensor assembly includes a substrate mounted on the at least one first receiver, and wherein the substrate is positioned between the second bus bar and a raised section of the first bus bar.

3. The bus bar assembly of claim 1, wherein the at least one first receiver includes two first receivers, each of the first receivers extends from a side of the second housing that extends parallel to a longitudinal axis of a body of the second bus bar.

4. The bus bar assembly of claim 1, wherein a first body of the first bus bar includes:
a first bend extending from the raised section of the first body at a first angle;
a first leg extending from the first bend;
a second bend extending from the first leg at a second angle; and
a first extension extending from the second bend.

5. The bus bar assembly of claim 4, wherein a second body of the second bus bar includes:
a third bend extending from the second body at a third angle;
a second leg extending from the third bend;
a fourth bend extending from the second leg at a fourth angle; and
a second extension extending from the fourth bend.

6. The bus bar assembly of claim 5, wherein the first leg extends along a direction substantially parallel to the second leg.

7. The bus bar assembly of claim 5, wherein the first extension extends in a first direction and the second extension extends in a second direction opposite to the first direction.

8. The bus bar assembly of claim 1, wherein:
the first bus bar includes a first body that extends through the first housing and defines a base, a step, and a raised section,
the second bus bar includes a second body that extends through the first housing and engages the second housing,
a first area of the first bus bar corresponds with the raised section of the first body, a first cross-section of the first bus bar in the first area being continuous in at least two planes; and
a second area of the second bus bar corresponds with the first area and a portion of the second housing including the at least one receiver, a second cross-section of the second bus bar in the second area being continuous in the at least two planes.

9. The bus bar assembly of claim 8, wherein the raised section of the first bus bar defines a first bus facing surface, wherein a surface of the second bus bar corresponding to the second area defines a second bus facing surface, and wherein a distance between the first bus facing surface and the second bus facing surface is less than 4 millimeters (mm).

10. The bus bar assembly of claim 9, wherein the distance is in a range of approximately 2 mm to approximately 4 mm.

11. The bus bar assembly of claim 1, wherein the first bus bar is a positive bus bar and the second bus bar is a negative bus bar.

12. The bus bar assembly of claim 11, wherein the at least one first receiver includes a casting in contact with a second body of the second bus bar, wherein the casting is configured to provide a ground for the second bus bar.

13. The bus bar assembly of claim 11, wherein a power signal is applied to the bus bar assembly and a magnetic flux generated by the first bus bar is added to a magnetic flux generated by the second bus bar at least in a space coinciding with the sensor assembly.

14. A bus bar comprising:
a body;
a housing surrounding the body;
at least one first receiver extends from a first side of the housing;

a sensor assembly mounted on housing; and a fastener engaged to the sensor assembly and the at least one first receiver, wherein a first portion of the body corresponds to a second portion of the housing including the at least one first receiver, and wherein a cross-section of the first portion of the body is continuous in at least two planes.

15. The bus bar of claim 14, wherein the housing includes an end face, and wherein a second receiver extends from the end face.

16. The bus bar of claim 15, wherein the body includes:

a first bend extending at a first angle relative to plane corresponding to the first portion of the body;

a leg extending from the first bend;

a second bend extending from the first leg at a second angle; and an extension extending from the second bend, wherein the leg is disposed between the first portion of the body and the end face of the housing.

17. The bus bar of claim 14, wherein sensor assembly includes:

a substrate;

a connector mounted on the substrate; and a current sensor mounted on the substrate, wherein the substrate defines an aperture, and wherein the fastener engages the aperture.

18. The bus bar of claim 17, wherein the current sensor is positioned on the substrate between the first side of the housing and a side of the housing opposite the first side.

19. A bus bar assembly comprising:

a first housing;

a first bus bar including a first body extending through the first housing, the first body defining a base, a step, and a raised section;

a second bus bar including a second body extending through the first housing and a second housing engaged to the second body, the second housing defining a receiver configured to engage a fastener, wherein a first area of the first bus bar corresponds with the raised section of the first body, a first cross-section of a first portion of the first bus bar corresponding to a location of the sensor assembly is continuous in at least two planes, and wherein a second area of the second bus bar corresponds with the first area and a portion of the housing including the receiver, a second cross-section of a second portion of the second bus bar corresponding to the location of the sensor assembly is continuous in the at least two planes.

20. The bus bar assembly of claim 19, further comprising a current sensor mounted to the receiver, wherein a power signal is applied to the bus bar assembly and a magnetic flux generated by the first bus bar is added to a magnetic flux generated by the second bus bar at least in a space that coincides with a location of the current sensor.

\* \* \* \* \*